(12) United States Patent
Shiota et al.

(10) Patent No.: US 7,358,715 B2
(45) Date of Patent: Apr. 15, 2008

(54) SEMICONDUCTOR INTEGRATED CIRCUIT

(75) Inventors: Ryoji Shiota, Kanagawa (JP); Hiroyuki Sekiguti, Kanagawa (JP); Kaoru Maruyama, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/500,498

(22) Filed: Aug. 8, 2006

(65) Prior Publication Data

US 2007/0043995 A1 Feb. 22, 2007

(30) Foreign Application Priority Data

Aug. 8, 2005 (JP) ............... 2005-229334

(51) Int. Cl.
G01R 31/28 (2006.01)
H03K 3/02 (2006.01)
G06F 11/00 (2006.01)
(52) U.S. Cl. ............ 324/73.1; 327/185; 714/744
(58) Field of Classification Search ............ None
See application file for complete search history.

(56) References Cited

U.S. PATENT DOCUMENTS

| 5,130,647 A | 7/1992 | Sakashita et al. |
| 5,134,612 A | 7/1992 | Yoshimura |
| 5,524,114 A | 6/1996 | Peng |
| 2002/0047748 A1* | 4/2002 | Fujita ............ 331/49 |
| 2002/0080901 A1* | 6/2002 | Ham ............ 375/376 |
| 2003/0079106 A1* | 4/2003 | Yasuda ............ 711/220 |
| 2004/0217786 A1* | 11/2004 | Saeki ............ 327/156 |
| 2005/0268191 A1* | 12/2005 | Shin ............ 714/726 |

FOREIGN PATENT DOCUMENTS

| JP | 2-183642 | 7/1990 |
| JP | 3-218483 | 9/1991 |
| JP | 8-201481 | 8/1996 |

* cited by examiner

*Primary Examiner*—Andrew H. Hirshfeld
*Assistant Examiner*—Jeff Natalini
(74) *Attorney, Agent, or Firm*—McDermott Will & Emery LLP (57) ABSTRACT

By mounting, on a semiconductor integrated circuit, a clock stability waiting circuit 4 for deciding whether a clock signal generated by a high speed clock generating circuit 2 is stable or not, a scan pass control circuit 7 capable of switching a scan pass structure based on a signal output from the clock stability waiting circuit 4 and an activation control circuit 6 capable of switching an order circuit to be activated based on the signal output from the clock stability waiting circuit 4, it is possible to carry out a parallel test in a stability waiting time having a high speed clock. Moreover, it is possible to externally monitor a signal capable of deciding a stability of a high speed clock. Therefore, it is easy to decide whether a failure is caused by a high speed clock generating portion or an internal circuit.

6 Claims, 8 Drawing Sheets

SEMICONDUCTOR INTEGRATED CIRCUIT

BACKGROUND OF THE INVENTION

1. Field of the Invention

The present invention relates to a scan test technique of a semiconductor integrated circuit.

2. Description of the Related Art

In a scan test of a semiconductor integrated circuit, it is desirable that the test should be carried out in the same timing as a normal operating speed. In order to achieve the execution, it is necessary to carry out the test by using, as a clock, a delay pulse formed by two pulse waves having an interval which is almost equivalent to an operating clock. Such a test will be hereinafter referred to as a delay pulse test.

Conventionally, JP-A-8-201481 Publication has disclosed a technique for carrying out the delay pulse test at a high frequency which is equivalent to an internal clock. In the technique, a clock signal having a comparatively low frequency is input from an outside and a clock signal having a comparatively high frequency which is the same as that in the normal operation of a semiconductor integrated circuit is generated from an internal clock generating portion (for example, a PLL circuit) based on the input clock, thereby generating a delay pulse having a delay width which is equal to a cycle of an internal clock signal. If the scan test is carried out by using the generated delay pulse through the method, it is possible to perform an AC-based test which is the same as the normal operation of the semiconductor integrated circuit so that a problem of a clock skew can also be verified sufficiently.

With the conventional structure, however, a clock signal having a comparatively high frequency which is the same as that in the normal operation is generated in the internal clock generating portion. Therefore, a time is required for stabilizing the clock signal. Consequently, there is a possibility that an LSI inspection cost might be increased. In the case in which the PLL circuit is used, for example, there is a possibility that an effective failure diagnosis result cannot be obtained when a malfunction is caused by the PLL circuit. For this reason, it is necessary to add a test item for the PLL circuit.

SUMMARY OF THE INVENTION

It is an object of the invention to reduce an inspection cost and to obtain an effective failure diagnosis result by a mechanism capable of effectively utilizing a time required for stabilizing a clock signal generated in an internal clock generating portion and a mechanism for discriminating the generation of a malfunction caused by the clock generating portion.

The invention comprises a dividing circuit for generating a dividing clock signal of a comparatively low speed clock signal which is input from an outside, a high speed clock generating circuit such as a PLL circuit for generating a high speed clock signal which is the same as that in a normal operation based on the dividing clock signal, a clock stability waiting circuit for deciding whether the clock signal generated by the high speed clock generating circuit is stable or not, a pulse generating circuit for outputting the high speed clock signal for only a certain period, a scan pass control circuit for switching a scan pass structure based on a signal output from the clock stability waiting circuit, and an activation control circuit for switching an order circuit to be activated based on a signal output from the clock stability waiting circuit.

In the invention, the dividing circuit can switch a dividing ratio based on a phase relationship between the comparatively low speed clock signal input from the outside and the dividing clock signal.

In the invention, the clock stability waiting circuit serves to input a clock signal output from the dividing circuit and to count the clock signal, thereby deciding whether the clock signal is stable or not.

In the invention, the pulse generating circuit can decide that a clock is stable by the clock stability waiting circuit and can then switch the number of times for generation of a pulse depending on whether the high speed clock signal is captured in a scan pass test or not.

In the invention, the scan pass control circuit can constitute a scan pass by a group to be operated in response to the high speed clock signal and a group to be operated in response to the comparatively low speed clock signal input from the outside.

In the invention, the activation control circuit can switch a shift operation/normal operation mode of the order circuit based on the signal output from the clock stability waiting circuit.

According to the invention, it is possible to reduce an inspection cost and to obtain an effective failure diagnosis result by a mechanism capable of effectively utilizing a time required for stabilizing a clock signal generated in an internal clock generating portion and a mechanism for deciding whether a malfunction is caused by the clock generating portion or not.

DESCRIPTION OF THE PREFERRED EMBODIMENTS

Figure 1:
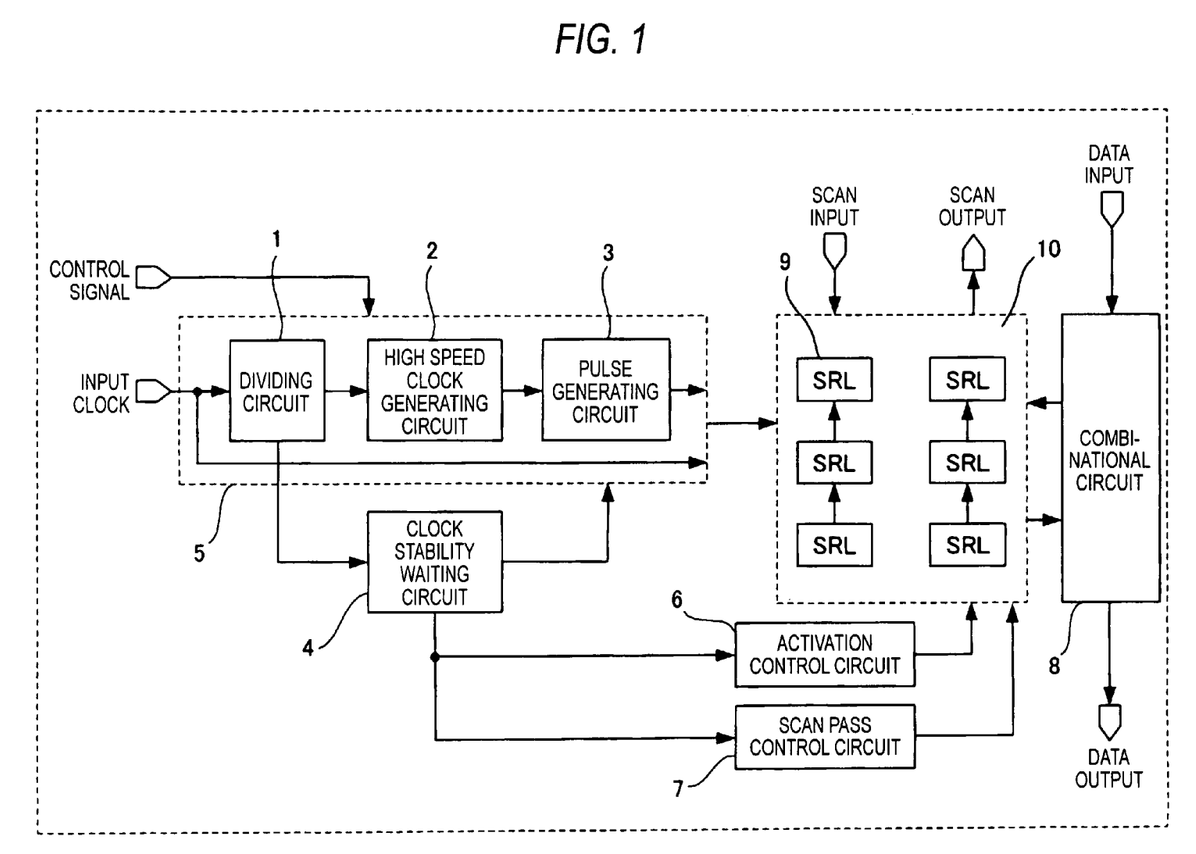
FIG. 1 is a block diagram showing a structure of a semiconductor integrated circuit according to an embodiment of the invention.

FIG. 1 is a block diagram showing a structure of a semiconductor integrated circuit according to an embodiment of the invention. In FIG. 1, 1 denotes a dividing circuit portion, 2 denotes a high speed clock generating circuit portion, 3 denotes a pulse generating circuit portion, 4 denotes a clock stability waiting circuit portion, 5 denotes a circuit portion for generating a clock having a frequency required in an operation, 6 denotes an activation control circuit portion, 7 denotes a scan pass control circuit portion, 8 denotes a combinational circuit portion, 9 denotes an SRL portion and 10 denotes an order circuit portion.

In the structure, a reference clock signal is generated from an input clock by the dividing circuit 1, and a high speed clock signal which is the same as that in the normal operation is generated from the reference clock signal by the high speed clock generating circuit 2. Then, the number of pulses corresponding to the contents of the test is generated by the pulse generating circuit 3 in response to the high speed clock signal. In that case, a pulse generation timing is controlled in response to a control signal sent from the clock stability waiting circuit 4. Moreover, the activation control circuit 6 and the scan pass control circuit 7 control the behavior of the order circuit portion 10 constituted by the SRL portion 9 based on the control signal sent from the clock stability waiting circuit 4.

Based on the above sequence, test data are input from a scan input and are monitored from a scan output to decide a pass/fail of a result of the test. In that case, it is possible to reduce an inspection cost and to obtain an effective failure diagnosis result by a mechanism capable of effectively utilizing a time required for stabilizing a clock signal generated by an internal clock generating portion and a mechanism for deciding whether a malfunction is caused by the clock generating portion or not.

Figure 2:
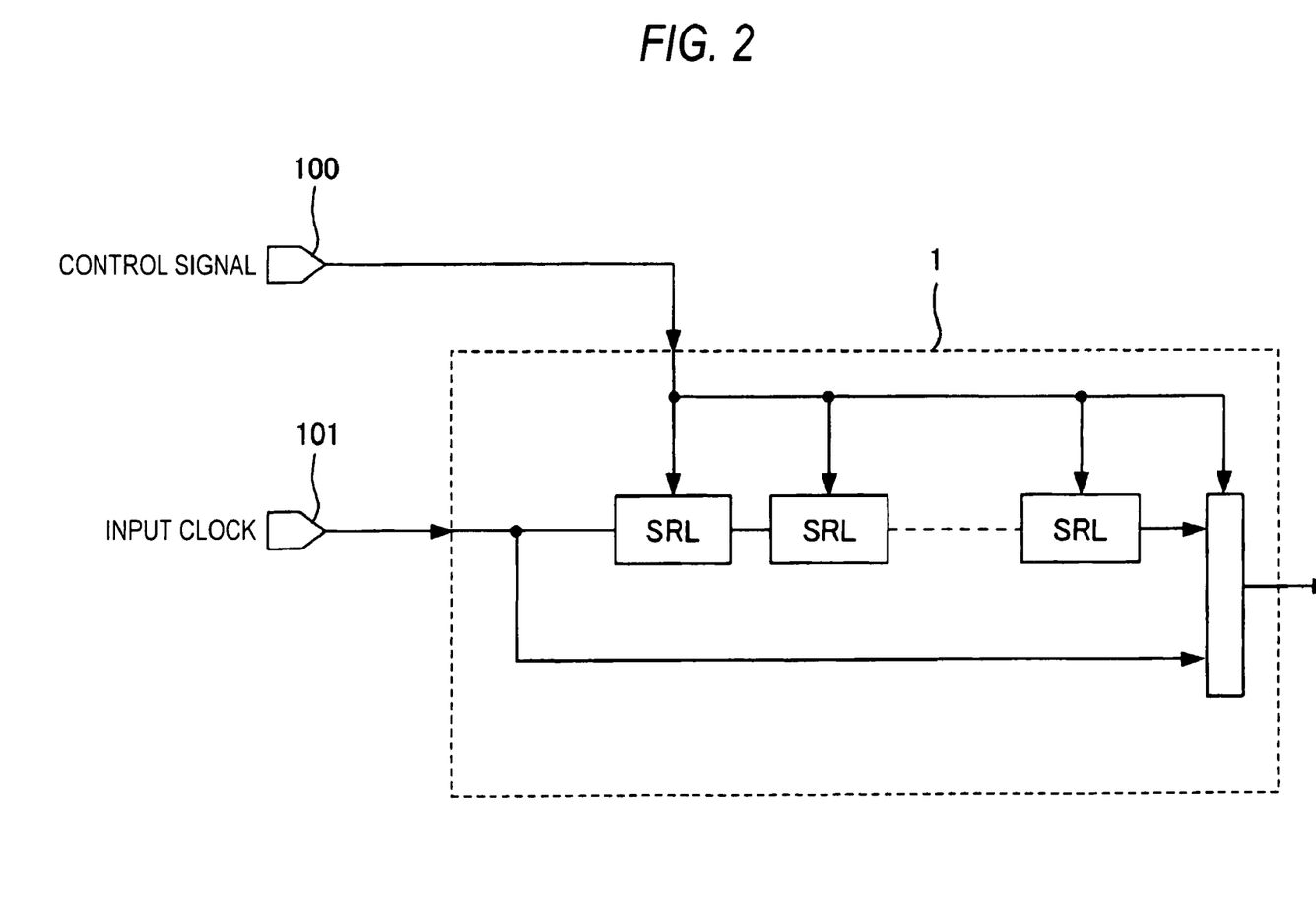
FIG. 2 is a diagram showing a structure of a dividing circuit in the semiconductor integrated circuit according to the invention.

FIG. 2 is a block diagram showing a structure of the dividing circuit 1. In FIG. 2, 100 denotes a control signal and 101 denotes an input clock. In the structure, a reference clock signal required in an inner part is generated by the dividing circuit using the SRL from the control signal 100 and the input clock 101. Consequently, it is possible to generate a reference clock signal having a different frequency from that of the input clock 101.

Figure 3:
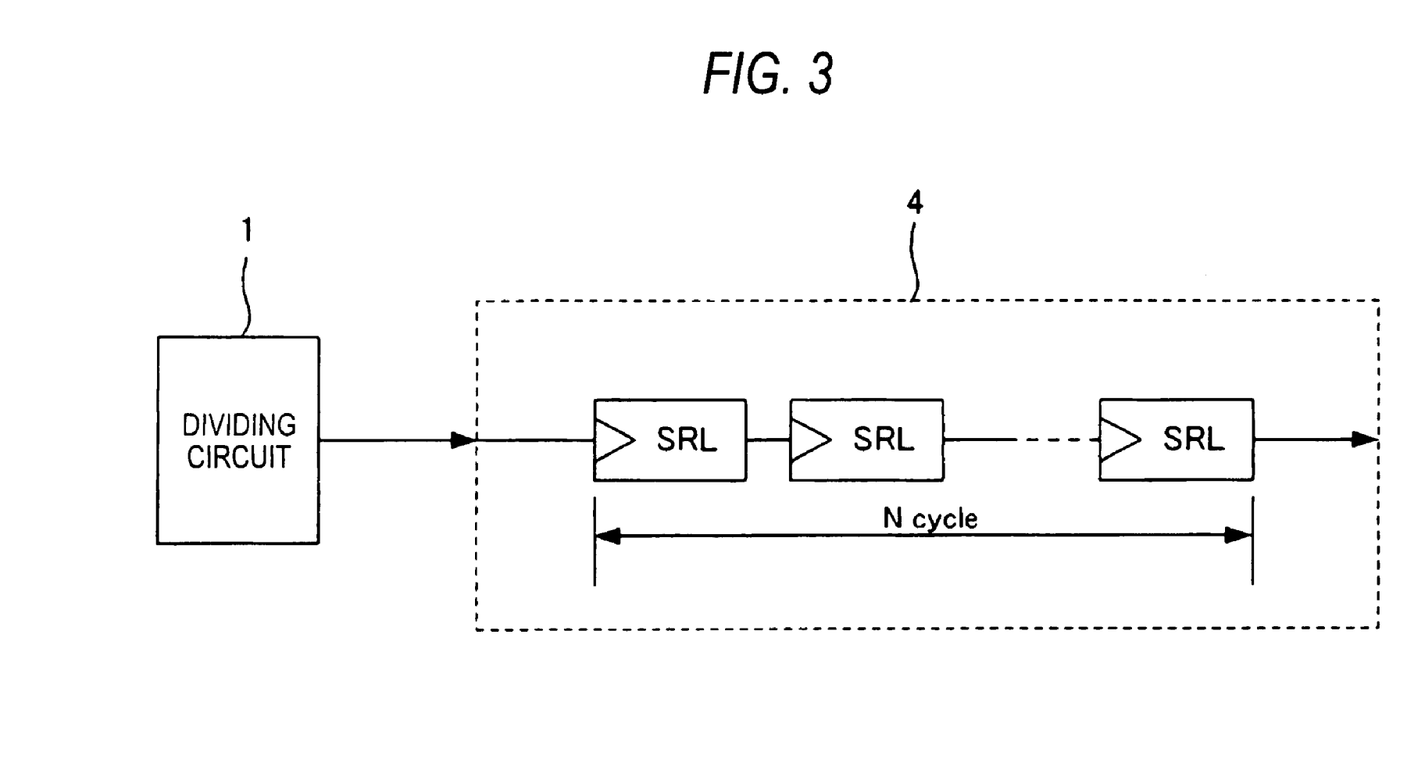
FIG. 3 is a diagram showing a structure of a clock stability waiting circuit portion in the semiconductor integrated circuit according to the invention.

FIG. 3 is a block diagram showing a structure of the clock stability waiting circuit portion 4. In FIG. 3, the circuit portion having the SRL structure is constituted in such a manner that count-up is carried out corresponding to the number of necessary cycles based on the reference clock generated by the dividing circuit 1 through a counter, for example, and an enable signal is output only when the number of the necessary cycles of the reference clock is satisfied. Consequently, the time required for stabilizing the clock signal generated by the internal clock generating portion can be utilized effectively, thereby reducing an inspection cost.

Figure 4:
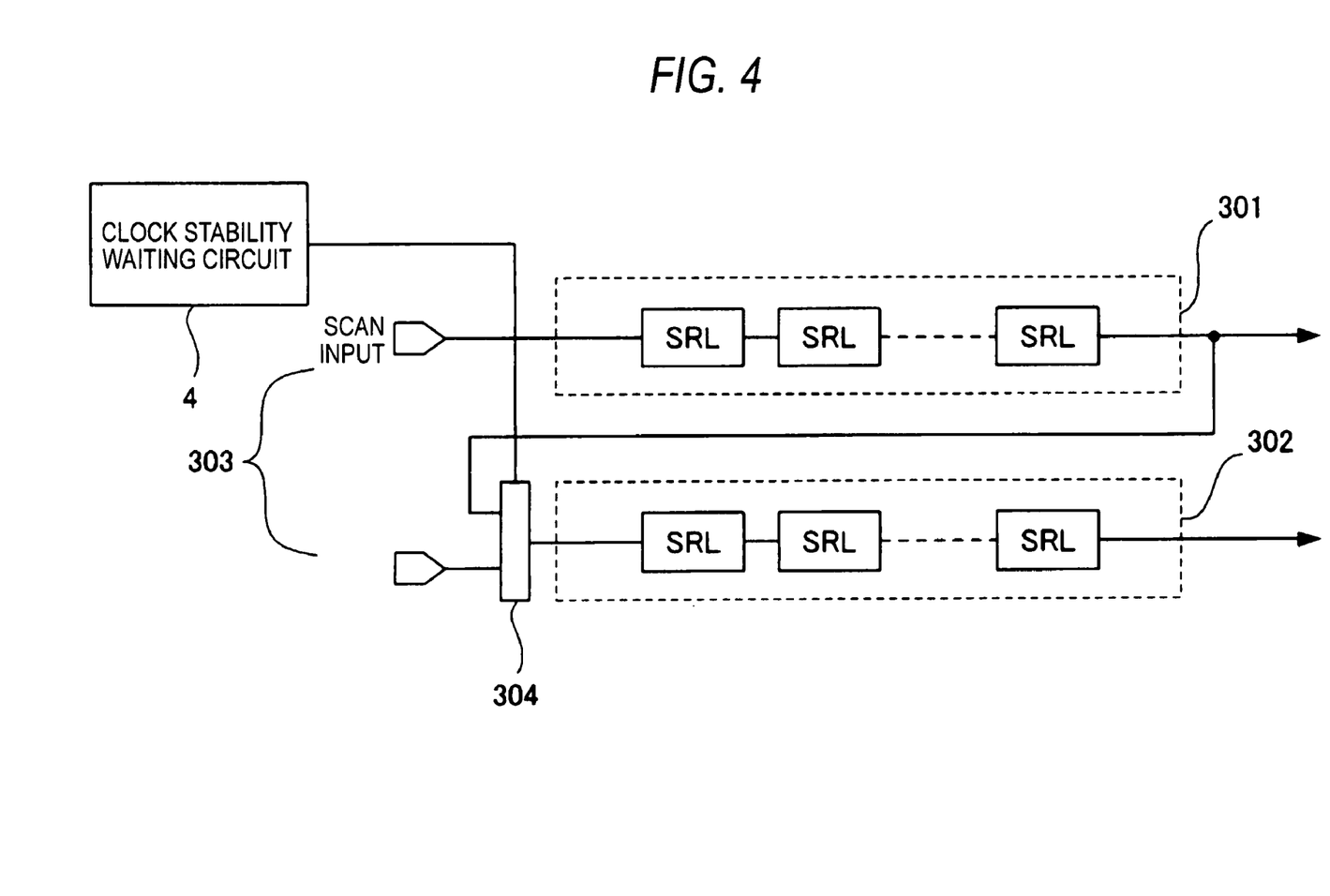
FIG. 4 is a diagram showing a specific example of a scan pass control circuit in the semiconductor integrated circuit according to the invention.

FIG. 4 is a block diagram showing a specific example of the scan pass control circuit 7. In FIG. 4, 301 and 302 denote scan chain portions to be operated at low speed clocks, respectively, 303 denotes a scan input, 304 denotes a scan stage number switching circuit portion, and 4 denotes a clock stability waiting circuit portion.

The scan stage number switching circuit portion 304 selects an output of the scan input 303 or the scan chain portion 301 as data to be input to the scan chain portion 302 based on a control signal generated in the clock stability waiting circuit portion 4. By carrying out switching into the number of scan operation stages, consequently, it is possible to effectively utilize a clock stability waiting time, thereby reducing the inspection cost.

Figure 5:
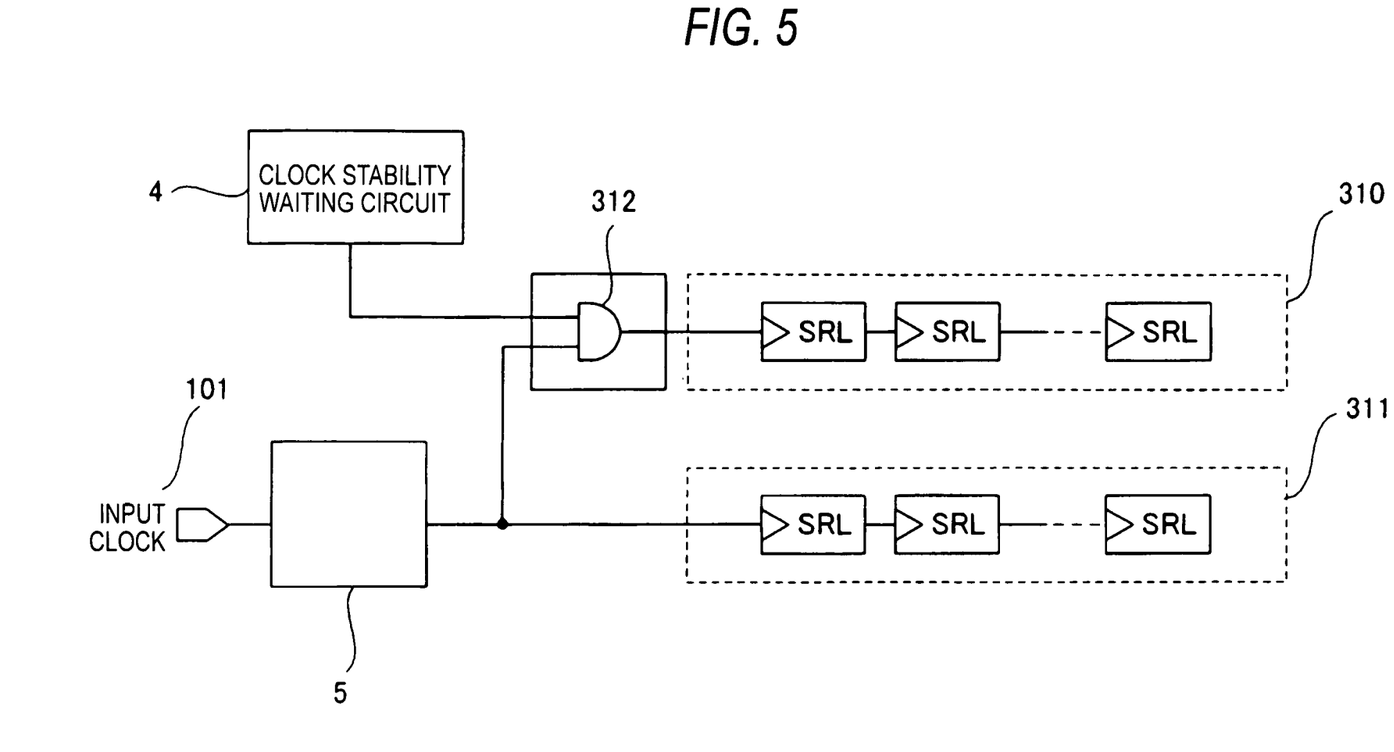
FIG. 5 is a diagram showing a specific example of the scan pass control circuit in the semiconductor integrated circuit according to the invention.

FIG. 5 is a block diagram showing another specific example of the scan pass control circuit 7. In FIG. 5, 310 denotes a scan chain portion to be operated at a low speed clock, 311 denotes a scan chain portion to be operated at a high speed clock, 312 denotes a scan stage number switching circuit portion, 4 denotes a clock stability waiting circuit portion, 5 denotes a circuit portion for generating a clock having a frequency required in an operation, and 101 denotes an input clock.

The scan stage number switching circuit portion 312 carries out ON/OFF control of a clock signal to be sent to the chain portion 310 to be operated at the low speed clock based on a control signal generated in the clock stability waiting circuit portion 4. By carrying out switching into the number of scan operation stages which can be executed in a clock stability waiting time, consequently, it is possible to effectively utilize the clock stability waiting time, thereby reducing the inspection cost.

Figure 6:
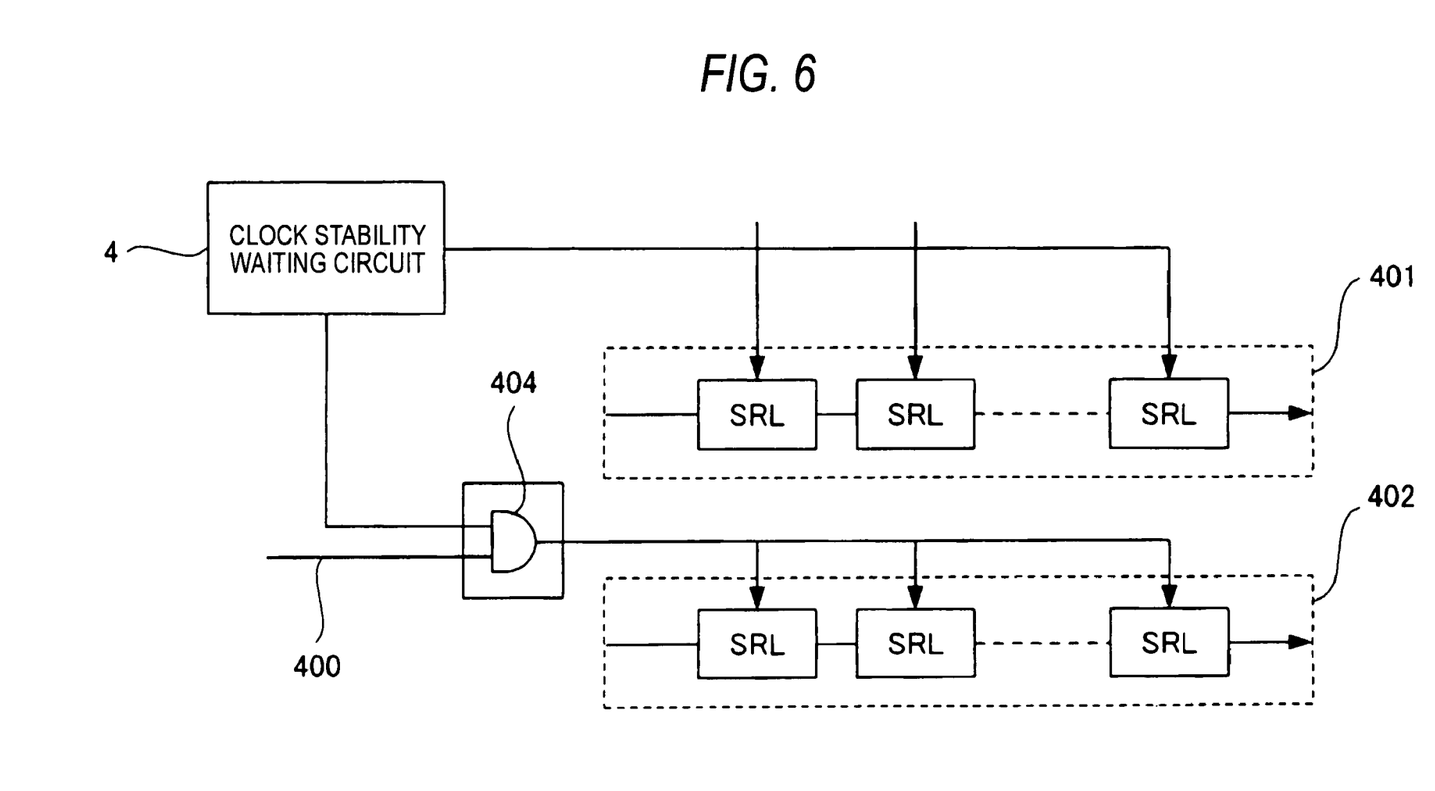
FIG. 6 is a diagram showing a specific example of an activation control circuit portion in the semiconductor integrated circuit according to the invention.

FIG. 6 is a diagram showing a specific example of the activation control circuit portion 6. In FIG. 6, 401 denotes a scan chain portion to be operated in response to a low speed clock, 402 denotes a scan chain portion to be operated in response to a high speed clock, 403 denotes a control signal, 404 denotes a specific example of the activation control circuit portion 6, and 4 denotes a clock stability waiting circuit portion.

The activation control circuit portion 404 controls an SRL operation of the scan chain portion 402 to be operated in response to the high speed clock based on a control signal generated in the clock stability waiting circuit portion 4 and the control signal 403 (for example, shift/capture). By carrying out switching into a scan operation which can be executed in the clock stability waiting time, consequently, it is possible to effectively utilize the clock stability waiting time, thereby reducing the inspection cost.

Figure 7:
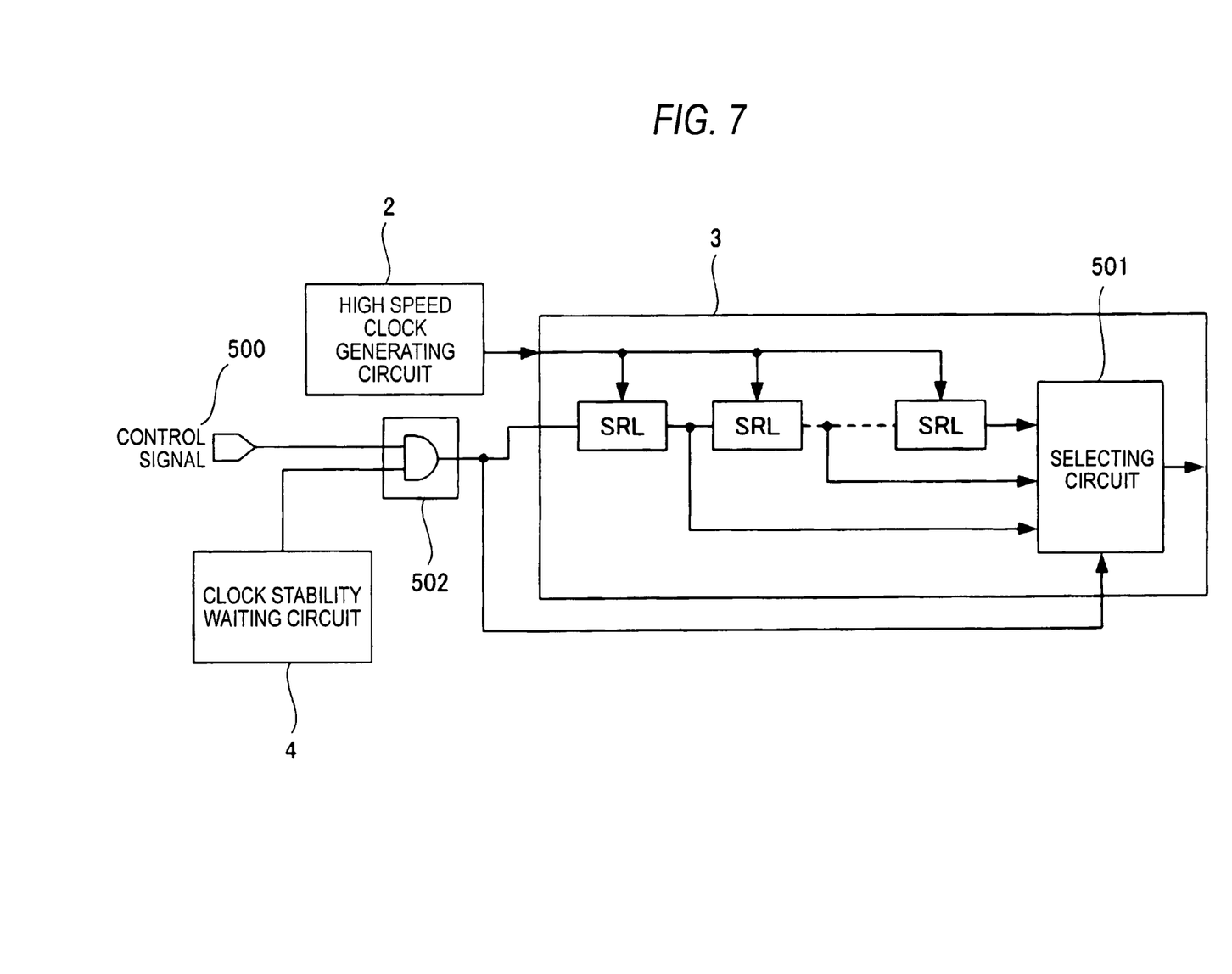
FIG. 7 is a diagram showing a structure of a pulse generating circuit portion in the semiconductor integrated circuit according to the invention.

FIG. 7 is a block diagram showing a structure of the pulse generating circuit portion 3. In FIG. 7, the pulse generating circuit portion 3 is constituted by an order circuit and a selecting circuit 501, and 500 denotes a control signal, 502 denotes a circuit portion for controlling any failure to be a target for pattern generation, 2 denotes a high speed clock generating circuit portion, and 4 denotes a clock stability waiting circuit portion.

The circuit portion 502 determines the number of pulses to be generated corresponding to any failure to be a target based on the control signal 500 and the signal sent from the clock stability waiting circuit portion 4. The selecting circuit 501 is controlled to give the pulse condition to the pulse generating circuit portion 3 and to output only the number of necessary pulses from a high speed clock generated in the high speed clock generating circuit portion 2. Consequently, it is possible to discriminate a malfunction caused by the high speed clock generating circuit portion 2, thereby obtaining an effective failure diagnosis result.

Figure 8:
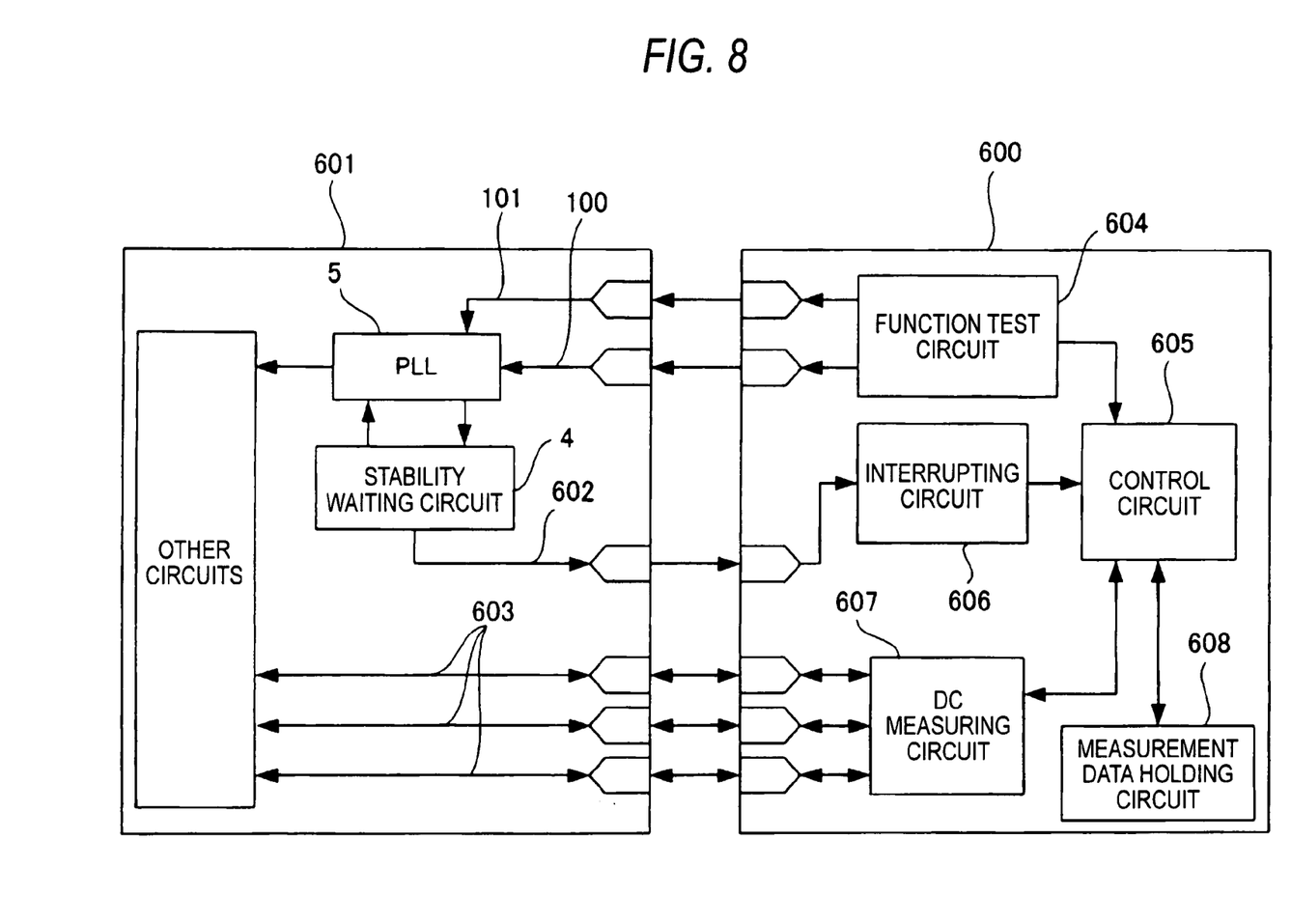
FIG. 8 is a diagram for explaining a state in which the semiconductor integrated circuit according to the invention is inspected by an LSI inspecting apparatus.

FIG. 8 is a diagram for explaining a state in which the semiconductor integrated circuit according to the invention is inspected by an LSI inspecting apparatus. In FIG. 8, 600 denotes an LSI inspecting apparatus and 601 denotes a semiconductor integrated circuit. A control portion 605 of the LSI inspecting apparatus 600 causes a function test circuit 604 to output the control signal 100 and the input clock 101. In the semiconductor integrated circuit 601, consequently, the circuit portion 5 for generating a clock having a frequency required in an operation is operated.

Then, the control portion 605 sends a control signal to a DC measuring circuit 607, thereby starting a DC measurement. In the semiconductor integrated circuit 601, a control signal 602 is output from the clock stability waiting circuit 4 when the operation of the clock generating circuit portion 5 is stabilized.

An interrupting circuit 606 of the LSI inspecting apparatus 600 sends an interruption signal to the control portion 605 upon receipt of the control signal 602. The control portion 605 receives the interruption signal and temporarily saves a measuring state and measuring result of the DC measuring circuit 607 in a measurement data holding circuit 608 at that time, thereby starting a function test for the semiconductor integrated circuit 601.

After the completion of the function test, an end signal is sent from the function test circuit 604 to the control portion 605. Upon receipt of the signal, the control portion 605 reads DC measurement information during an interruption from the measurement data holding circuit 608 and sends a measurement restarting signal to the DC measuring circuit 607, thereby restarting the DC measurement which is being interrupted.

Moreover, an interruption processing on the LSI inspecting apparatus side is carried out in addition to the embodiment so that another inspecting step is executed in the clock stability waiting time. Consequently, it is possible to effectively utilize the clock stability waiting time of the circuit portion 5 for generating a clock having a frequency required in the operation. Thus, the inspection cost can be reduced.

A clock stability waiting circuit portion for deciding whether a clock signal generated in a high speed clock generating circuit according to the invention is stable or not has an effective information output function in order to analyze an operation of a high speed clock generating portion which is internally generated and is useful for a failure analysis in an SRAM BIST using a PLL and a function test in addition to a scan pass test.

What is claimed is:

1. A semiconductor integrated circuit, comprising:
   a dividing circuit, for generating a dividing clock signal of a comparative low speed clock signal which is input from an outside;
   a high speed clock generating circuit such as a PLL circuit for generating a high speed clock signal which is the same as that in a normal operation based on the dividing clock signal;
   a clock stability waiting circuit for deciding whether the clock signal generated by the high speed clock generating circuit is stable or not;
   a pulse generating circuit for outputting the high speed clock signal for only a certain period;
   a scan pass control circuit for switching between plural scan path configurations based on a signal output from the clock stability waiting circuit; and
   an activation control circuit for switching an order circuit to be activated based on a signal output from the clock stability waiting circuit.

2. The semiconductor integrated circuit according to claim 1, wherein the dividing circuit switches a dividing ratio based on a phase relationship between the comparatively low speed clock signal input from the outside and the dividing clock signal.

3. The semiconductor integrated circuit according to claim 1, wherein the clock stability waiting circuit inputs a clock signal output from the dividing circuit and counts the clock signal, thereby deciding whether the clock signal is stable or not.

4. The semiconductor integrated circuit according to claim 1, wherein the pulse generating circuit decides that a clock is stable by the clock stability waiting circuit and then switches the number of times for generation of a pulse depending on whether the high speed clock signal is captured in a scan pass test or not.

5. The semiconductor integrated circuit according to claim 1, wherein the scan pass control circuit constitutes a scan pass by a group to be operated in response to the high speed clock signal and a group to be operated in response to the comparatively low speed clock signal input from the outside.

6. The semiconductor integrated circuit according to claim 1, wherein the activation control circuit switches a shift operation/normal operation mode of the order circuit based on the signal output from the clock stability waiting circuit.

* * * * *